United States Patent [19]
Wessells et al.

[11] Patent Number: 5,147,761
[45] Date of Patent: Sep. 15, 1992

[54] METHOD FOR PREPARING RELIEF IMAGE PRINTING PLATES

[75] Inventors: Forrest A. Wessells, Deltona, Fla.; Edward T. Murphy, Douglasville; Steven A. Tambornini, Atlanta, both of Ga.

[73] Assignee: W. R. Grace & Co.-Conn., New York, N.Y.

[21] Appl. No.: 535,819

[22] Filed: Jun. 11, 1990

[51] Int. Cl.$^5$ .............................................. G03F 7/00
[52] U.S. Cl. .................... 430/306; 430/310; 430/325; 430/328; 430/394; 430/396
[58] Field of Search ............... 430/310, 325, 328, 394, 430/396, 306, 310, 325, 328, 394, 396; 355/78, 71, 125, 113; 362/290, 291, 279, 342, 16

[56] References Cited

U.S. PATENT DOCUMENTS

| | | | |
|---|---|---|---|
| 2,905,070 | 9/1959 | Gelb | 95/75 |
| 2,971,083 | 2/1961 | Phillips et al. | 240/78 |
| 3,503,681 | 3/1970 | Jöns et al. | 362/342 |
| 3,808,421 | 4/1974 | Willumsen | 240/78 |
| 4,059,754 | 11/1977 | Lewin | 362/217 |
| 4,927,723 | 5/1990 | Cusdin | 430/306 |

FOREIGN PATENT DOCUMENTS 1123417 8/1968 United Kingdom .

*Primary Examiner*—Charles L. Bowers, Jr.
*Assistant Examiner*—Janis L. Dote
*Attorney, Agent, or Firm*—John J. Wasatonic; William L. Baker

[57] ABSTRACT

A method is provided for producing relief images having improved image fidelity and resolution. The method comprises positioning an image bearing negative transparency closely adjacent and substantially parallel to a layer of a photocurable material; positioning on the other side of the negative from the photocurable material and in substantially parallel relationship thereto at least one louver having a plurality of open cells, each cell extending through the louver along an axis perpendicular to the negative and having reflective side surfaces contoured to reflect and redirect rays of radiant energy incident thereon to a direction more normal to the negative surface; and passing radiant energy which is capable of curing the photocurable material through the louver and the negative and onto and through the photocurable material for a time sufficient to form a latent relief image in the photocurable material. The present invention is further directed to an apparatus for producing a latent relief image using the above method. The apparatus comprises, in sequence, a planar support for the photocurable layer, a negative in substantially parallel relation to the support, at least one louver which is positioned parallel in its major plane to the negative, and, immediately adjacent to the louver, a radiation source for irradiating the photocurable layer through the louver and the negative and effecting curing thereof.

The method and apparatus of the invention are especially useful for the production of improved high resolution half-tone and line relief images.

12 Claims, 6 Drawing Sheets

METHOD FOR PREPARING RELIEF IMAGE PRINTING PLATES

BACKGROUND OF THE INVENTION

This invention relates to a method and apparatus for preparing relief printing plates using photocurable materials. More particularly, this invention relates to a method and apparatus for improving the image fidelity and character geometry of the relief image formed on such plates.

At one point in time relief printing plates were manufactured of metal, for example zinc or magnesium, by photoengraving techniques requiring relatively long etching periods for formation of the relief pattern. More recently, photocurable materials have been substituted for metals in the formulation of printing plates. In the manufacture of relief printing plates from photocurable materials, a layer of a liquid or solid material is used which undergoes Polymerization, cross-linking, or other curing reaction in response to irradiation by actinic light, usually ultraviolet light. The actinic light is passed first through a negative and then through the photocurable material to selectively cure or harden the material in a pattern corresponding to the image borne by the negative. The negative is an image bearing transparency consisting of substantially opaque and substantially transparent areas. Photocuring takes place in the exposed areas, i.e., those areas of the photocurable layer corresponding positionally to the substantially transparent areas of the negative, and no photocuring takes place in the nonexposed areas. The photocurable layer may also be exposed from the side opposite the negative. Generally, this "back exposure" is non-imagewise and used to form a hardened base for the raised printing indicia formed by the front exposure. Back exposure is typically used where the photocurable material is a liquid. The exposed layer is then developed by removal of the unexposed, unhardened portions with an air knife, developer solvent, or other means to form a relief image.

In producing relief images from half-tone negatives, it is required to produce in the relief relatively small diameter raised printing indicia in what are otherwise recessed areas of the relief. These areas print the lighter or "highlight" areas of the image and the raised indicia in these areas and are accordingly referred to as "highlight dots". The size and density of highlight dots control shading or tone in the light image areas. The half-tone relief image also generally contains relatively shallow, small diameter depressions in what are otherwise overall raised areas of the relief. These areas print the darker or "shadow" areas of the image and the depressions are generally referred to as "shadow reverses". As with the highlight dots, the size and density of shadow reverses control the tone in the darker image areas.

The production of satisfactory highlight dots and shadow reverses in relief images by photoexposure techniques presents unique problems. Due to the small size of the transparent dots in the half-tone negative used to produce highlight dots, it is generally desired to provide a high image exposure dose in order to assure formation of the dots and adequate depthwise curing. Such curing is needed to anchor the dot to the image base. However, a high radiation dose has an adverse effect on the formation of shadow reverses. Shadow reverses are formed beneath relatively small opaque areas of the negative in an otherwise predominantly transparent area. A high exposure dose can result in overexposure of these areas, i.e., beneath the opaque areas, thus resulting in unwanted curing of the photocurable material and filling in of the shadow reverses.

The high image exposure dose also results in overexposure in the peripheral areas outside of the transparent dot areas of the half-tone negative. This results in increased dot image area, i.e., the relief dot is larger than the corresponding transparent areas of the negative. In addition, the overexposure results in a higher, broader shoulder profile on the dot. This leads to the printing of smudges and larger than intended dots, particularly where there is any overimpression during printing.

Although a lower radiation dose can be used to lessen the filling in of shadow reverses and improve dot shoulder geometry, the lower dose often results in unsatisfactory formation and anchoring of the highlight dots. In addition, it has been observed that the highlight dots have a substantially greater tendency to move or otherwise deform during the photoexposure step when lower intensity radiation is used. Such dot movement or deformation is not fully understood but is believed to be due, at least in part, to shrinkage of the photocurable material as curing occurs. Dot movement is highly undesirable, resulting not only in positional displacement of the dot but also the formation of a streak or tail behind the dot, and in the direction of movement, which becomes part of the relief image and adversely affects the quality of images printed with the plate.

For many photocurable systems, there is no exposure dose which satisfactorily provides both highlight dots and shadow reverses, and the operator is thus forced to make undesired compromises in exposure dose and image quality. For other systems, there may be an exposure dose which provides generally acceptable highlight dots and shadow reverses, but this almost always occurs in a very narrow "window" of doses, thus attaching a very high degree of criticality to the exposure. The narrow window also means a high risk of error in the exposure step, particularly where there is variability in the intensity of the actinic radiation or in the photoresponse of the photocurable material from one lot to another.

Although the foregoing focuses on the problems with image fidelity and resolution encountered in preparing half-tone relief images, it will be appreciated that similar problems can occur in the formation of other types of high resolution relief images, such as line images. It should also be appreciated that these problems are unique to the formation of relief images by photoexposure, deriving from the fact that the photoexposure must provide an image having not only length and breadth dimensions, but also a substantial and significant depth dimension. The necessity of forming this third image dimension places unique demands on the photosensitive system and the photoexposure method which are not encountered in those processes and systems used to form only two dimensional images, such as in conventional photographic or photocopying systems.

SUMMARY OF THE INVENTION

The present invention is directed to a photoexposure method for preparing relief images which substantially reduces or eliminates the difficulties discussed above and thus provides relief printing plates having superior image fidelity and resolution. In one embodiment, the invention is directed to the production of half-tone relief images using the photoexposure method, whereby both highlights dots and shadow reverses having desired image fidelity and character geometry are formed and a substantially broadened exposure window for the formation of such dots and reverses is obtained. With the photoexposure method of the invention, the highlight dots have a desired shoulder profile, are satisfactorily anchored to the image base, exhibit little or no movement or deformation during photoexposure, and have a printing surface area which corresponds closely with that of the corresponding transparent dot areas of the half-tone negative. These advantages are achieved without sacrificing the quality of shadow reverses in the relief image. Thus, shadow reverses are obtained having a substantial depth, without filling in of the reverse, and a size and shape which closely approximate the size and shape of the corresponding opaque areas of the half-tone negative.

The photoexposure method of the invention involves the use of certain light reflective louvers which are interposed between the radiation source and the negative. The method comprises positioning an image bearing negative transparency closely adjacent and substantially parallel to a layer of a photocurable material; positioning on the other side of the negative from the photocurable material and in substantially parallel relationship thereto at least one louver having a plurality of open cells, each cell extending through the louver along an axis perpendicular to the negative and having reflective side surfaces contoured to reflect and redirect rays of radiant energy incident thereon to a direction more normal to the negative surface; and Passing radiant energy which is capable of curing the photocurable material through the louver and the negative and onto and through the photocurable material for a time sufficient to form a latent relief image in the photocurable material.

The cellular openings in the louvers are polygonal in shape, preferably square or hexagonal. The wall members which serve to partition the cells may be wedge-shaped or curved in cross-section. Curved surfaces are preferred, especially those having a radius of curvature of about 9 to 13 inches. Regardless of the configuration of the cell walls, the area of the cell opening at the surface of the louver facing the radiation source (the "inlet opening") will be smaller than the cross-sectional area of the opening of the cell at the surface of the louver facing the negative (the "outlet opening").

In a preferred embodiment, two louvers are arranged in series, interposed between the radiation source and the negative. The louver closer to the negative is preferably composed of cells having substantially smaller inlet and outlet opening areas than those of the cells of the louver nearest to the source of radiation.

The present invention is further directed to an apparatus for producing a latent relief image using the above method. The apparatus comprises, in sequence, a planar support for the photocurable layer, a negative in substantially parallel relation to the support, at least one louver which is positioned parallel in its major plane to the negative, and a radiation source. The louver is positioned immediately adjacent to the source, i.e., nothing is between the louver and the source which effects or alters the direction of the rays of light energy which are emitted by the source.

The latent relief image produced by the method and apparatus of the invention may be developed in conventional fashion using an air knife, developer solvent, or other methods which are known in the art, thereby providing a relief pattern of cured material having superior resolution and fidelity to the image of the negative.

DETAILED DESCRIPTION OF THE INVENTION

Figure 1:
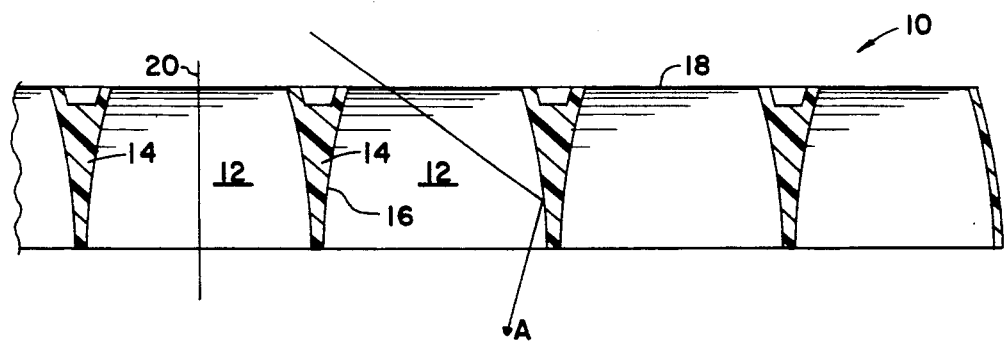
FIG. 1 is a partial cross-sectional view of a preferred louver element for use in the present invention.

The invention provides a method for producing a high resolution relief image comprising the steps of positioning an image bearing negative transparency closely adjacent and substantially parallel to a layer of a photocurable material; positioning on the other side of the negative from the photocurable material and in substantially parallel relationship thereto at least one louver having a plurality of open cells, each cell extending through the louver along an axis perpendicular to the negative and having reflective side surfaces contoured to reflect and redirect rays of radiant energy incident thereon to a direction more normal to the negative surface; and passing radiant energy which is capable of curing the photocurable material through the louver and the negative and onto and through the photocurable material for a time sufficient to form a latent relief image in the photocurable material. As used herein, the term "latent relief image" refers to the cured but undeveloped image in the photocurable layer. The term "photocurable material" refers to any solid or liquid material or composition which undergoes polymerization, cross-linking, or any other curing or hardening reaction in response to actinic radiation, usually ultraviolet radiation, with the result that the unexposed portions of the material can be selectively separated and removed from the exposed (cured) portions to form a three dimensional or relief pattern of cured material.

The separation and removal of the unexposed portions can be accomplished using a jet of air ("air knife"), brushing, selective solubilization or dispersion in a suitable developer solvent or detergent solution, a squeegee, a combination of the foregoing, or other suitable development means. A wide variety of photocurable materials are known in the art and any of these may be used in the present invention. The layer of photocurable material used to form the relief image has a significant depth of at least about 0.005 inches, more typically at least about 0.01 inches, and is curable throughout.

The positioning of the negative closely adjacent to the photocurable material means that the negative can be in direct contact with the photocurable layer or the negative and photocurable layer may be narrowly spaced apart with an air gap or a thin film or cover sheet between them. Such films and cover sheets are well known in the art. Where the negative and photocurable layer are spaced apart, the distance between them is preferably less than 0.01 inch, more preferably less than 0.005 inch. The negative may be placed in direct contact with photocurable layers having dry, non-tacky surfaces, such that the negative is not damaged in use or when stripped from the layer after exposure.

As illustrated hereinafter, the louvers used in the invention contain a plurality of cells having cell walls which reflect radiation emitted from the source at severely oblique angles to the plane of the negative. The cell walls reflect this radiation to a direction more normal to the negative plane. A substantial amount of radiation, however, including radiation which is emitted by the source at more moderate oblique angles is unaltered by passage through the louver.

The desired redirection of radiant energy at severe oblique angles to the negative plane requires that the cell walls are angled inward, i.e., toward the central axis of the cell which is perpendicular to the plane of the negative. The cell openings will thus have different areas and, as indicated above, the louver surface having the smaller cell openings faces the radiation source.

Figure 2:
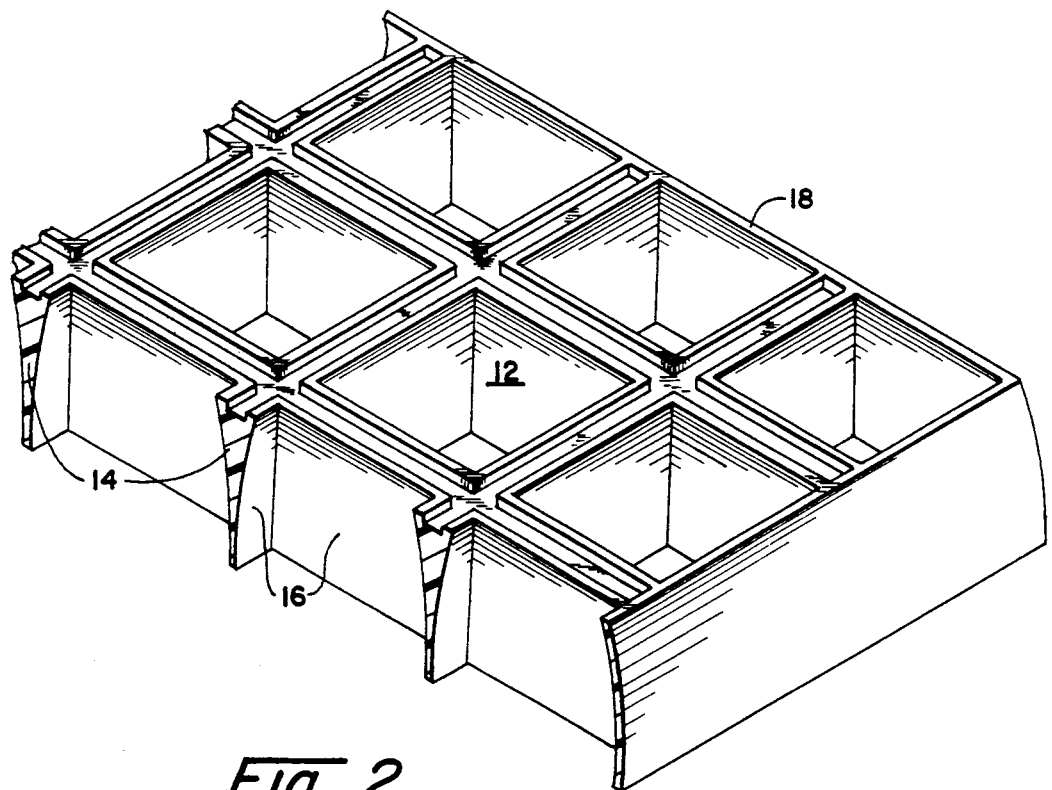
FIG. 2 is an perspective view of the louver element shown in FIG. 1.

The cell walls may be flat or curved. Concave cell walls having a single curvature are preferred. In cross-section, the concave curvature may have a circular, parabolic, or other suitable geometric profile. Referring to FIGS. 1 and 2, there are shown, respectively, cross-sectional and perspective views of a preferred louver configuration having concave cell walls. The louver 10 has a plurality of cells 12 extending therethrough. The cells 12 are defined by partition elements 14 having mirrored surfaces 16 which serve to reflect radiation incident thereon. Surfaces 16 are curved and angled inward so that the cell openings at surface 18 are smaller than those at the opposite surface. Radiation entering louver 10 at an oblique angle to planar surface 18 is redirected as exemplified by arrow A in a direction more parallel to the axes 20 of cells 12. As shown by FIG. 2, the cells 12 have square openings at the top and bottom of the louver.

Figure 3:
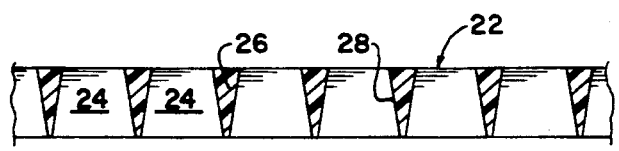
FIG. 3 is a partial cross-sectional view of another louver element which is suitable for use in the present invention.
Figure 4:
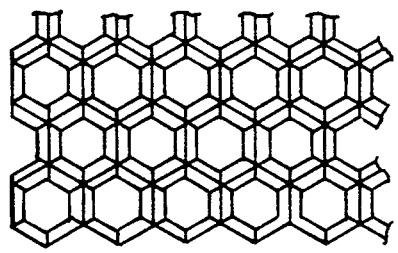
FIG. 4 is a partial bottom view of yet another embodiment of a louver element suitable for use in the present invention.

FIG. 3 shows a cross-sectional view of another louver which can be used in the invention. The louver 22 also has a plurality of cells 24 extending through the louver and defined by partition elements 26 having mirrored surfaces 28. Partition elements 26 are wedge shaped so that surfaces 28 are flat. Another louver is shown in FIG. 4 wherein the cell partitions in cross-section may have the profile of those in FIGS. 1 or 3, but the cell openings are hexagonal in shape.

The louver cells may vary in size from about $\frac{3}{8}$ inch on a side to abut 4 inches on a side, as measured at the larger cell opening. Preferably, the cell openings are square and range in size from about $\frac{1}{4}$ inch to 2 inches on a side. The louvers generally have a thickness in the range of about $\frac{3}{8}$ inch to 3 inches, preferably about $\frac{1}{4}$ inch to 2 inches. The thickness of the louvers generally increases with increasing cell size.

In a preferred embodiment, at least two louvers are positioned between the negative and the radiation source. It is preferred that the cell outlet openings of each louver have different areas, and especially preferred to position the louver having the largest cell outlet opening closest to the radiation source with each successive louver having successfully smaller cell outlet openings. It is particularly preferred to use two louvers in series, with each louver having square cell openings and concave cell walls. Preferably these concave cell walls have a radius of curvature of about 9 to 13 inches. The louver closer to the radiation source has the larger cell openings, preferably measuring from 1 to 4 inches on a side, while the other louver has cell outlet openings preferably measuring from $\frac{1}{4}$ to 1 inch on a side.

Figure 5:
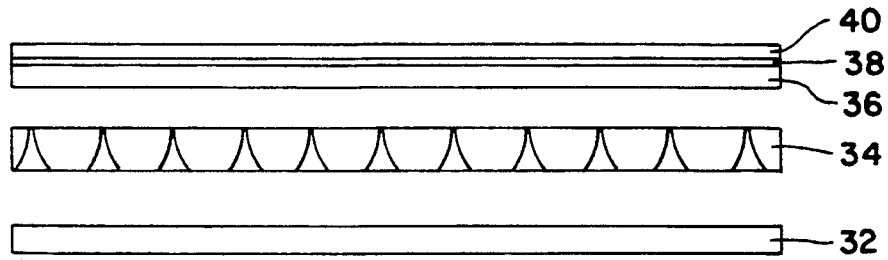
FIG. 5 is a schematic, cross-sectional view illustrating the major components of an apparatus of the present invention.

In FIG. 5, the essential components of a photoexposure apparatus of the invention are shown in cross-section. The apparatus 30 contains an exposure lamp system 32, which consists of an array of elongate lamps which in their total extent approximate the length and breadth dimensions of louver 34. Generally, the lamps are tubular, ultraviolet-emitting lamps which are arranged in parallel. Situated adjacent to the lamps is a louver 34. For illustration, louver 34 is shown to have parabolic cell walls. The smaller cell opening faces lamps 32. Louver 34 is in spaced relation to lamps 32, preferably with the distance between the bottom surface of the louver and the central axes of the lamps 32 in the range of about 3 to 5 inches. Positioned above louver 34 is a glass support plate 36 having on its upper surface a negative 38 and a layer 40 of photocurable material.

Figure 6:
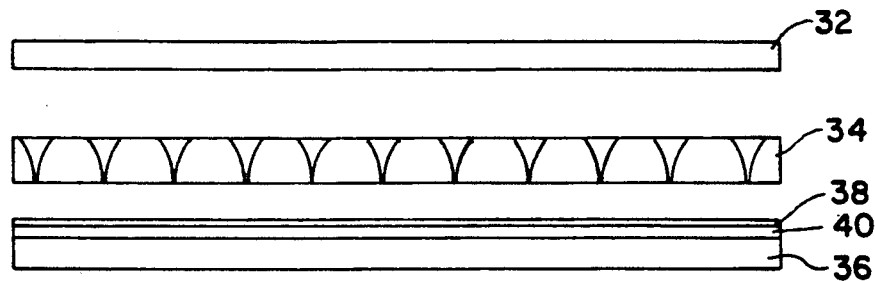
FIG. 6 is a schematic, cross-sectional view of an alternative apparatus of the invention.
Figure 7:
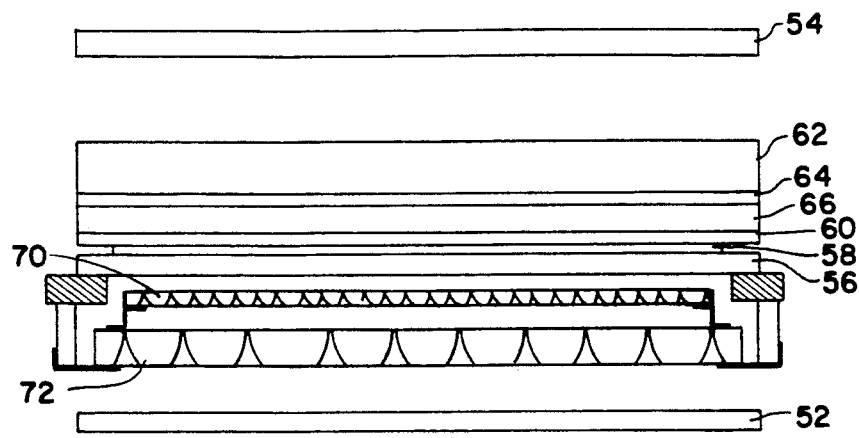
FIG. 7 is a schematic, cross-sectional view of an apparatus of the invention which is adapted for the photoexposure of liquid photocurable materials.
Figure 8:
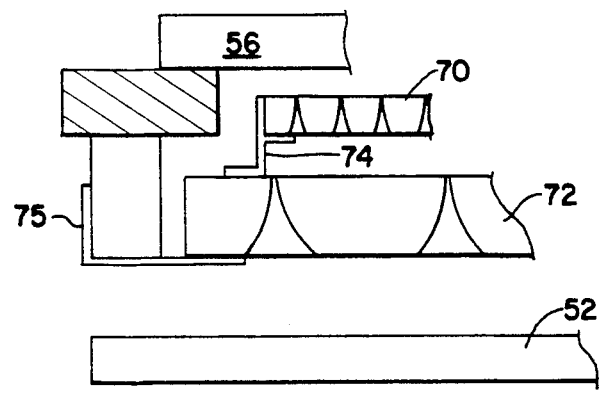
FIG. 8 is a magnified cross-sectional view showing the detail of the end section depicted in FIG. 7.

As illustrated by FIGS. 5-7, the louver or louvers used in the invention are positioned parallel to the negative which is in turn parallel to the photocurable layer. The louver is displaced from the negative a distance sufficient to avoid casting a shadow through the negative and onto the photocurable layer which will form a corresponding grid pattern in the relief image. However, it is desirable to place the louver as close as possible to the negative in order to minimize the distance between the radiation source and the photocurable layer. Unexpectedly, it has been found that the louver can be positioned at relatively close distances to the photocurable layer, where a discernible shadow pattern is cast onto the photocurable layer, without development of the pattern in the relief image. The exact minimum distance can be determined empirically and will depend on the louver or combination of louvers which is used and, to a lesser extent, on the photocurable material and exposure dose. Certain preferred louver systems, further described hereinafter, can be satisfactorily placed as close as 1-$\frac{1}{4}$ inches from the surface of the Photocurable layer without development of the shadow pattern in the relief image.

In FIG. 5, the louver 34 is spaced away from the glass 36. In an alternative embodiment, the upper surface of the louver may be in contact with the glass and thus function as a support for the glass. The use of the louver as a support may be especially advantageous in larger formate systems where the glass or other transparent support has a greater tendency to sag under its own weight.

An alternative embodiment of the apparatus of the invention is shown in FIG. 6, wherein like numerals refer to the like elements of FIG. 5. The elements are arranged differently, however, in that negative 38 is positioned opposite the photocurable layer 40 from support 36. Negative 38 may be in contact with the surface of layer 40, as shown, or it may be closely spaced from the surface with an air gap or thin protective layer in between. Such protective layers and their use are well known in the art.

One preferred embodiment of an apparatus of the present invention which is used for the photoexposure of liquid photopolymers is illustrated in FIG. 7. Basically, the preferred embodiment is a commercially available W. R. Grace 3048 plate making system fitted with a pair of louvers in accordance with the present invention. Similar machines available from other manufacturers can also be manufactured or retrofitted in accordance with the present invention.

Figure 9:
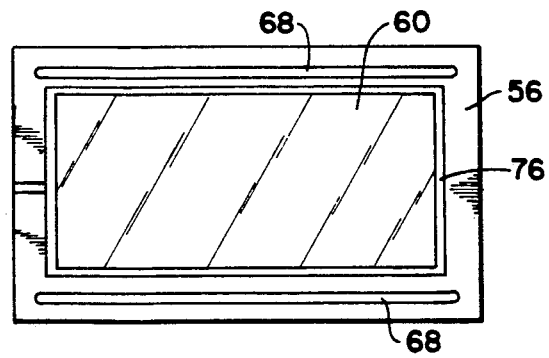
FIG. 9 is a plan view of the image exposure plate which is a part of the apparatus depicted in FIG. 7.

The apparatus 50 is provided with a pair of elongated ultraviolet lamp system 52 and 54. In the W. R. Grace 3048 plate making system eighteen sixty inch long fluorescent ultraviolet lamps with a broad spectrum 300–400 nanometer emission are used as the exposure radiation source of lamp system 52. The back exposure lamp system 54 consists of 9 of the same type lamps used from image exposure. However, both low output and high output lamps with or without built-in reflectors and with or without filters may be used. A transparent image exposure plate 56 is designed to support a negative 58 on one surface. The image exposure plate 56 is a one inch thick pyrex glass plate having a 30 inch by 48 inch imaging area. The image exposure plate is horizontal and accommodates negative 58 or other type of phototool on its top surface which has a matte finish. A vacuum track boundary acts to pull a cover sheet 60 over the negative 58. See vacuum track 76 in FIG. 9. A second glass plate 62 serves as the back exposure plate and is arranged parallel to and aligned with the image exposure plate 56. Like image exposure plate 56, the back exposure plate 62 has a matte finish on one surface (the lower surface in FIG. 7) and is further provided with a boundary vacuum track (not shown) identical to that of FIG. 9. The boundary vacuum track serves to secure a backing sheet 64 which contacts the photocurable layer 66.

In operation, the image exposure plate 56 is set to the height required to produce the desired thickness printing plate. The negative 58 is then placed emulsion side up on the top surface of the image exposure plate 56 and a cover sheet 60 is drawn over the negative and vacuum applied to hold it flush against the image exposure plate 56, surrounding the periphery of negative 58. The system includes a dispense system (not shown) which dispenses and doctors a liquid photocurable material over the cover sheet 60 to a selected thickness to provide layer 66. After the spreading of the liquid layer 66 the backing sheet 64 is rolled (or drawn) over the top surface of the liquid photocurable layer 66. Subsequently, the back exposure plate 62 is lowered to come to rest on the tolerance bars 68 (see FIG. 9) thereby flattening the liquid photocurable material into a high tolerance layer 66, typically within 0.001 inch of the intended thickness. Vacuum is applied to draw the backing sheet 64 against the back exposure plate 62. Backing sheet 64 becomes permanently adhered to the photocured layer and thus effectively serves as a support in the relief image plate which is produced.

Louvers 70 and 72 are interposed between the image exposure lamps 52 and the image exposure plate 56, in a spaced relationship. The louvers 70 and 72 are supported at each end, by brackets 74 and 75. The presently preferred embodiment employs commercially available louvers marketed by the American Louver Co., Skokie, Illinois under the tradename "Paracube Chrome Fixture Lens" for both louvers 70 and 72. These preferred louvers have square cells and concave reflective cell walls. The louvers have approximately the same planar dimensions as the photocurable layer. Louver 72 has larger cell openings then louver 70. In accordance with this invention, the placement of the largest cell louvers closest to radiation source is preferred for the attainment of optimal image fidelity and resolution. Preferably the cell outlet area of louver 72 is at least 50% larger than the cell outlet area of louver 70. In a particularly preferred combination, louver 72 consists of a plurality of square cells which are 1-½ inches on a side at the outlet opening and louver 70 consists of a plurality of square cells which are ½ inch on a side at the outlet opening. Preferably, these louvers have depth dimensions of 1 inch and ½ inch, respectively. The optimal distances between the lamps, louvers, and photocurable layer can be determined empirically. It is a requirement, however, that the louver closest to the photocurable layer be sufficiently removed from the layer to avoid casting a shadow onto the layer which forms a corresponding grid pattern in the relief image. In the apparatus of FIG. 7, it has been found that the louver 70 can be positioned at a relatively minimal distance, e.g., at about 1-½ inches, from the photocurable layer without imaging the grid pattern. In addition, it has been found that the distances between the louvers 70 and 72 and between the louver 72 and the lamps 52 can also be kept to a relative minimum, e.g., about 1 to 3 inches in each case, such that the distance between the lamps and the photocurable layer is approximately the same as in the conventional photoimaging unit. This minimal spacing between the lamps and the photocurable layer is highly preferred in order to use the radiation emitted by the lamps most efficiently. In a preferred embodiment of the apparatus of FIG. 7, the distance from the central axis of lamps 52 and to the top surface of exposure plate 56 is about inches. In this embodiment, louver 72 comprises 1-½ inch square cells having concave cell walls and a depth of 1 inch, and is positioned at a distance of 3-¼ inches from its bottom surface to the central axis of lamps 52; louver 70 comprises ½ inch square cells having concave cell walls and a depth of ¼ inch, and is positioned such that its bottom surface is 1 inch from the top surface of louver 72; and the top surface of louver 70 is ½ inch from the bottom surface of exposure plate 56. Although louver 70 is only 1-½ inches from the photocurable layer and the louver combination casts a discernible shadow onto surfaces at that distance, the shadow grid pattern is not developed in the relief image.

The image exposure plate 56 is necessarily transparent to the radiation employed to cure or harden the phtocurable composition. The back exposure plate 62 may also be transparent to such radiation to allow the photocurable layer to be back exposed, thereby forming a hardened polymer layer which serves as a base of the relief image. The back exposure is generally an overall, non-imagewise exposure although it may be imagewise if desired, e.g., as described in copending U.S. patent application Ser. No. 203,782.

After exposure of the photocurable material, the vacuums are released, the back exposure plate 62 is raised, and the imaged plate is removed with the cover sheet 60 and backing sheet 64 in place. Cover sheet 60 is removed, while backing sheet 64 remains permanently adhered to the photocured layer. The uncured liquid photocurable material is then removed using an air knife, developer solvent, or other means. After development, the plate is generally subjected to a further overall exposure to further cure the relief.

The cover sheet 60 is typically a polypropylene film 0.001 inches thick which is drawn over the negative imaging area and vacuumed down to form a barrier interface to the liquid photopolymer. Use of the cover sheet 60 allows negative 58 or other phototool to be reused indefinitely.

In the presently preferred embodiment the backing sheet 64 is a polyester film of 0.005 inches thickness having a tie coat and is deployed by a laminator device which rolls the backing film onto the top surface of the liquid photocurable material and also rolls out excess material.

As above indicated, the exposure method of the invention provides significantly improved high resolution relief images and, in particular, provides an exposure of the photocurable layer which simultaneously forms desired highlight dots and shadow reverses in half-tone reliefs. Surprisingly, the re-orientation of actinic radiation which is effected by the louvers results in an exposure which functions in the manner of a high image dose in the formation and anchoring of highlight dots, and decreased dot movement and deformation, and simultaneously in the manner of a low image dose in the formation of high fidelity shadow reverses and vertical dot shoulders. In addition, the method provides a broadened latitude in exposure doses which can be used to provide this performance.

The invention is further described and illustrated in the following Examples, which are illustrative only and not intended to be of limiting effect.

EXAMPLE 1

A commercially available photopolymer resin sold under the tradename 50W by W. R. Grace & Co.-Conn. was doctored at a thickness of about 0.006 inches onto a polyester cover sheet which was vacuum held over a half-tone negative in the W. R. Grace 3048 plate making system. A second commercially available photopolymer, sold by W. R. Grace under the tradename 50 SP-ST was doctored onto the 50W layer, a polyester backing sheet laminated to the surface of the 50 SP-ST layer, and the back exposure plate vacuum drawn onto the layer to provide a total thickness of photopolymer of about 0.112 inches. The photopolymer layer was back exposed for 78 seconds to UV light having an intensity as measured at the negative of 2.6 to 3 MW/cm²/sec. The top vacuum was relieved and the photopolymer exposed through the negative without using any louvers between the lamps and the negative. Exposure time was 700 seconds using the same intensity UV light. The exposed plate was removed from the apparatus and developed using an air knife, followed by washing with a detergent solution. The plate was then rinsed with water, post-exposed to complete curing, and dried.

The half-tone negative had the following specifications:

| | |
|---|---|
| Thickness: | 0.004 in. |
| Screen: | 85 lines/in. |
| Highlight Dot Diameter: | 0.00175 in. (selected for comparison) |
| Shadow Reverse #1 (side): | 0.0023 in. (selected for comparison) |
| Shadow Reverse #2 (side): | 0.0042 in. (selected for comparison) |

Figure 10:
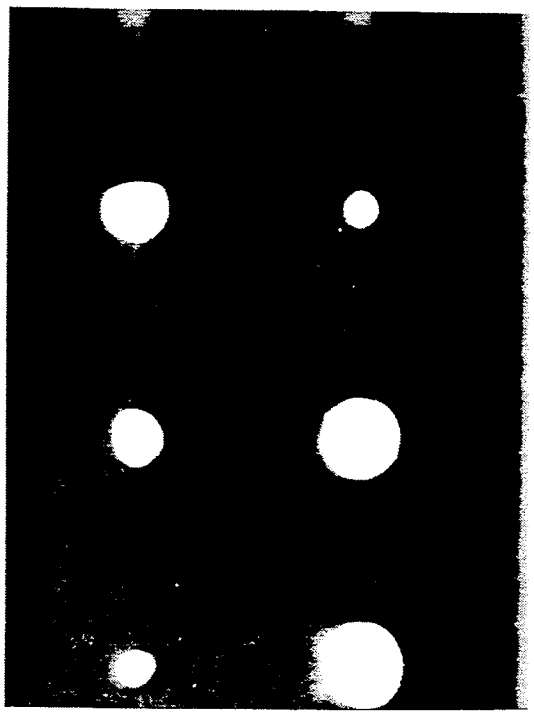
FIGS. 10 and 11 are photomicrographs of a half-tone negative used for photoexposure of highlight dots and shadow reverses, respectively.
Figure 11:
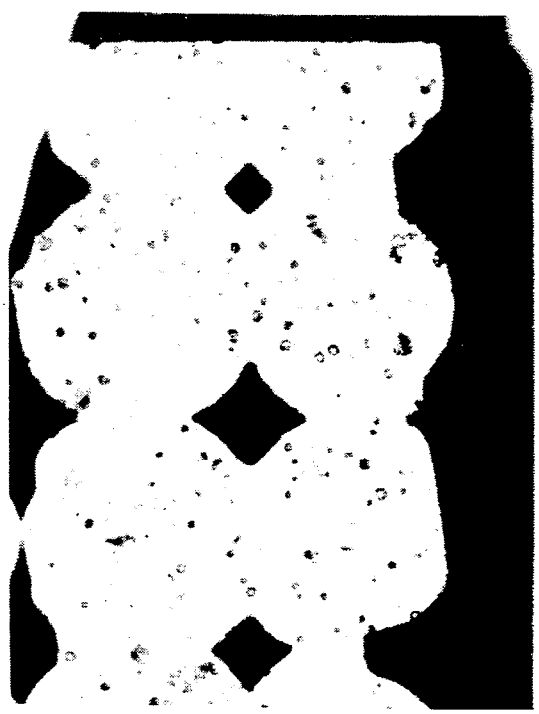

Photomicrographs of the negative are shown as FIGS. 10 and 11. FIG. 10 shows a highlight dot area with six highlight dots. The dot used for comparison is at the upper right corner. FIG. 11 shows a shadow reverse area with three reverses. The top and bottom reverses (#1 and #2 above, respectively) were used for comparison.

Figure 12:
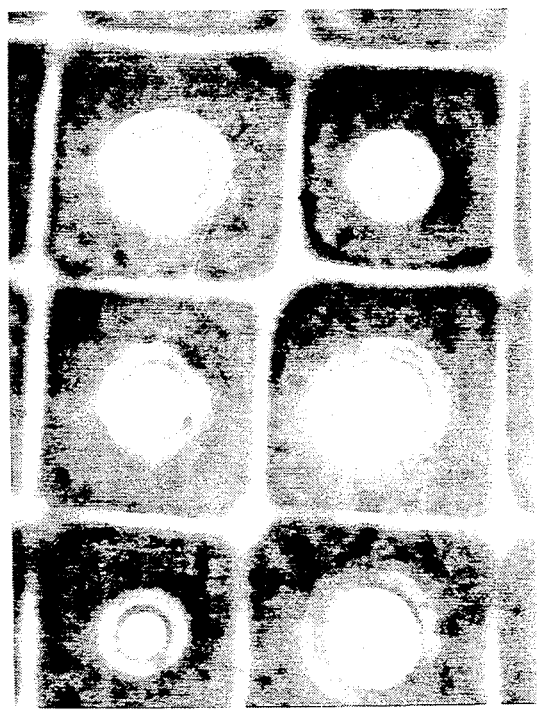
FIGS. 12 and 13 are photomicrographs of highlight dot and shadow reverse relief images obtained by conventional photoexposure through the negatives of FIGS. 10 and 11.
Figure 13:

The relief height (distance from the plate image surface to the plate floor) was 0.025 to 0.032 inches. The highlight dots and shadow reverses of the image are shown in FIGS. 12 and 13, respectively. In FIG. 12, the highlight dots are surrounded by a "halo", which is the relatively broad, high image shoulder of the dot. The dot diameter (measuring the inner circle) was measured at 0.0022 inches or 25.7% greater than the dot diameter of the negative. The dot image area was thus increased about 58%, without consideration of the potential added image area resulting from the broad shoulder.

In FIG. 13, the side of reverse 1 was measured at 0.0017 in., or 26% smaller than the reverse image on the negative, evidencing filling in of the reverse. The side of reverse 2 was measured at 0.0032 in., or 24% smaller than the reverse image on the negative.

Overall microscopic examination of the relief image revealed that approximately 50% of all highlight dots showed some sign of motion or deformation during image formation.

EXAMPLE 2

The apparatus of Example 1 was fitted with two Paracube Chrome Fixture Lens having respective square cell outlet openings of 1-½ inch and ½ inch, respective thicknesses of 1 inch and ½ inch, and concave curved reflective cell walls. The ½ inch louver was positioned closest to the negative with the larger cell openings facing the negative at a distance of ½ inch from the top louver surface to the underside of the image exposure plate (1-½ inches to the negative). The 1-½ inch louver was positioned between the ½ inch louver and the lamps with the larger cell openings facing the negative and distance of 1 inch between the facing surfaces of the respective louvers. The bottom surface of the 1-½ inch louver was 3-⅛ inches from the central longitudinal axis of the lamps.

A photocurable element was prepared as in Example 1 except that the first polymer coated was a commercially available photopolymer composition sold by W. R. Grace under the tradename 50 SP-ST Capping Resin. The photopolymer layer was exposed as in Example 1 except that the UV intensity as measured at the negative ranged from 4.0 to 4.5 MW/cm.²/sec., the back exposure time was 68 seconds and the image exposure time was 600 seconds. The relief was developed, post-exposed, and dried as in Example 1.

Figure 14:
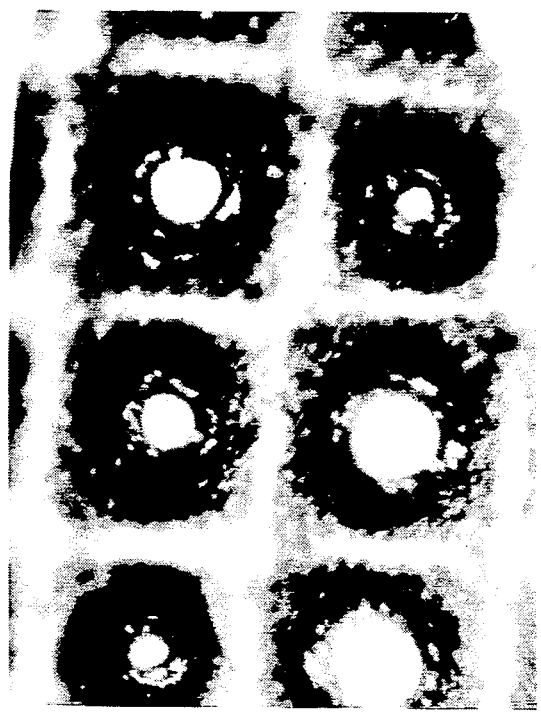
FIGS. 14 and 15 are photomicrographs of highlight dots and shadow reverses, respectively, produced by using the photoexposure method and apparatus of the invention.
Figure 15:
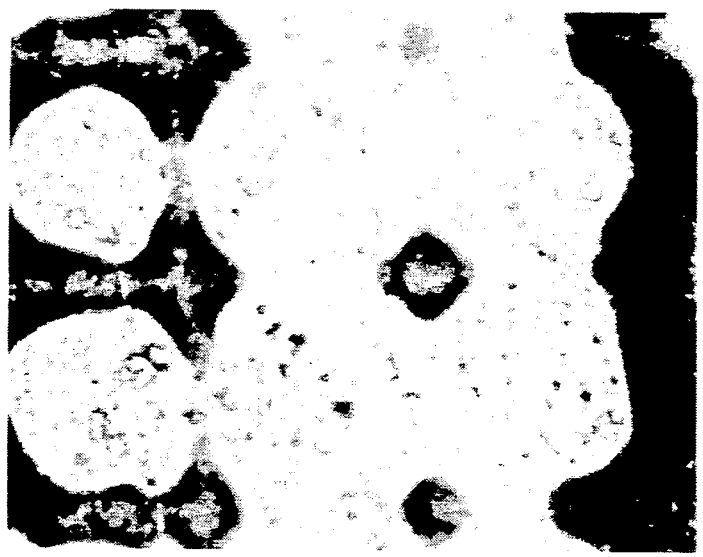

Photomicrographs of the highlight dots and shadow reverses are shown in FIGS. 14 and 15. FIG. 14 shows that, despite a higher image exposure dose (UV intensity multiplied by exposure time) than in Example 1 there is virtually no halo around the highlight dot, indicating a substantially more vertical shoulder profile. In addition, the dot diameter was measured to be 0.0015 inches, or slightly less than that of the negative.

With reference to FIG. 15, the reverses 1 and 2 were measured at 0.0025 inch and 0.00375 inch on a side, respectively, thus closely reproducing the corresponding images negative and providing deeper and larger reverses than those of Example 1.

Overall image evaluation revealed that less than 25% of all highlight dots showed some signs of motion or deformation.

The utilization of the louvers thus provided a substantial improvement in produced greater image fidelity in both the highlight dots and shadow reverses.

We claim:

1. A method for producing a high resolution latent relief image comprising the steps of:

positioning an image bearing negative transparency closely adjacent and substantially parallel to a layer of a photocurable material; positioning on the side of the negative transparency opposite said layer of photocurable material and substantially parallel thereto at least two louvers in series, each of said louvers having a plurality of open cells, each cell extending through the louver along an axis perpendicular to said negative transparency and having reflective cell walls contoured to reflect and redirect rays of radiant energy incident thereon to a direction more normal to the negative transparency surface, each of said louvers having different cell outlet areas; and passing radiant energy which is capable of curing said photocurable material through each of said louvers and said negative transparency and onto said layer of photocurable material for a time sufficient to form a latent relief image in said layer of photocurable material.

2. A method of claim 1 wherein first and second louvers are used in series, said first louver being positioned closer to the source of said radiant energy and having the larger cell outlet area.

3. A method of claim 2 wherein the cell outlet area of said first louver is at least 50% larger than the cell outlet area of said second louver.

4. A method of claim 1 wherein said cells have an opening area smaller at the surface of each of said louver facing the source of said radiant energy than at the surface of each of said louvers facing said negative transparency.

5. A method of claim 4 wherein said reflective cell walls are concave.

6. A method of claim 5 wherein the inlet and outlet openings of said cells are square.

7. A method of claim 1 wherein at least a portion of said negative transparency comprises a half-tone negative image.

8. A method of claim 1 further comprising developing said latent relief image by removing unexposed photocurable material from said layer of photocurable material.

9. A method of claim 8 wherein said unexposed photocurable material is removed by an air knife, a squeegee, a developer solvent, a detergent solution, brushing, or any combination of the same.

10. A method of claim 8 further comprising exposing the developed relief image to radiation to effect further curing thereof.

11. A method of claim 1 further comprising subjecting said layer of photocurable material to an imagewise or non-imagewise exposure from the side of the layer of photocurable material opposite said negative transparency.

12. A method of claim 1 wherein said radiant energy is passed through first and second louvers in series, said first louver being positioned closer to the source of radiant energy and comprising cells having concave cell walls and square outlet cell openings measuring between 1 to 4 inches on a side, said second louver comprising cells having concave cell walls and square outlet openings measuring between $\frac{1}{4}$ inch to 1 inch on a side.

* * * * *